(12) United States Patent
 Miao

(10) Patent No.: US 8,741,422 B2
(45) Date of Patent: *Jun. 3, 2014

(54) CARBON NANOTUBE PLATE LAYER AND APPLICATION THEREOF

(76) Inventor: Hsin Yuan Miao, Taichung (TW)

( * ) Notice: Subject to any disclaimer, the term of this patent is extended or adjusted under 35 U.S.C. 154(b) by 501 days.

This patent is subject to a terminal disclaimer.

(21) Appl. No.: 13/085,333

(22) Filed: Apr. 12, 2011

(65) Prior Publication Data

US 2012/0260961 A1    Oct. 18, 2012

(51) Int. Cl.
   *B82Y 99/00*     (2011.01)
   *H01L 35/28*    (2006.01)
   *B32B 3/00*     (2006.01)
   *B82Y 30/00*    (2011.01)

(52) U.S. Cl.
   CPC ................................ *B82Y 30/00* (2013.01)
   USPC ...................................................... 428/195.1

(58) Field of Classification Search
   USPC ...................................................... 428/195.1
   See application file for complete search history.

(56) References Cited

U.S. PATENT DOCUMENTS

| 6,790,425 | B1 |   | 9/2004  | Smalley et al. |
| 2007/0216032 | A1 | * | 9/2007 | Tee et al. ................... 257/774 |
| 2009/0044848 | A1 |   | 2/2009  | Lashmore et al. |
| 2009/0280242 | A1 | * | 11/2009 | Winarski ................... 427/130 |

OTHER PUBLICATIONS

Berger, Michael, "Novel buckypaper device converts light into electricity", Nanowerk, 2010, one page (www.nanowerk.com/spotlight/spotid=17392.php).

* cited by examiner

*Primary Examiner* — Mark Ruthkosky
*Assistant Examiner* — Ian Rummel
(74) *Attorney, Agent, or Firm* — Muncy, Geissler, Olds & Lowe, P.C.

(57) ABSTRACT

A carbon nanotube plate is provided, having a first carbon nanotube layer composed of many first carbon nanotubes, and a second carbon nanotube layer disposed on the first carbon nanotube layer. The second carbon nanotube layer is composed of many second carbon nanotubes placed in an orderly manner on the first carbon nanotube layer. At least two second carbon nanotubes are located along a curve. The surface of the second carbon nanotube layer has a whirlpool pattern.

10 Claims, 6 Drawing Sheets

(a)

(b)

(a)

(b)

CARBON NANOTUBE PLATE LAYER AND APPLICATION THEREOF

BACKGROUND OF THE INVENTION

1. Field of the Invention

The present invention is related to a carbon nanotube (CNT) plate and applications thereof. In particular, the present invention is related to a novel buckypaper and its applications. The applications pointed out by the present invention relate to a heat-sensitive battery.

2. Brief Discussion of the Related Art

A buckypaper is made of carbon nanotubes (CNTs) and is expressed as a "paper."

The weight of a volume of buckypaper materials is ten times less than that of the same volume of steel. However, a composition material made of stacked buckypaper materials provides stiffness five hundred times than that of steel. In addition, a buckypaper provides good conductivity, comparable to copper or silicon, and also provides good heat-dissipating qualities, comparable to iron or brass.

A traditional method for manufacturing buckypapers is disclosed in U.S. Pat. No. 6,790,425. The disadvantage of this method is that a buckypaper has an asymmetric distribution of CNTs. Such a characteristic of a traditionally-made buckypaper limits the electromagnetic behavior and heat-sensitivity of buckypapers.

Therefore, the present invention provides a novel buckypaper, and is used to eliminate the disadvantages of the traditional buckypaper. The buckypaper of the present invention may be applied to materials used for a heat-sensitive battery.

SUMMARY OF THE INVENTION

The present invention provides a CNT plate. The CNT plate comprises a first CNT layer, wherein the first CNT layer is composed of a plurality of first carbon nanotubes; and a second CNT layer disposed on the first CNT layer. The second CNT layer is composed of a plurality of second carbon nanotubes. The second carbon nanotubes are allocated in an orderly manner on the first CNT layer. At least two of the second carbon nanotubes are located along a first curve. The surface of the second CNT layer has a whirlpool pattern.

The present invention also provides an application of the CNT plate. In particular, the present invention provides a heat-sensitive battery as an application of such a CNT plate. The heat-sensitive battery comprises a first electrode, a second electrode, and a CNT plate. The CNT plate comprises a first end and a second end. The first electrode connects the first end electrically, while the second electrode connects the second end electrically. In addition, the CNT plate comprises a first CNT layer that comprises many first carbon nanotubes A second CNT layer is disposed on the first CNT layer. The second CNT layer comprises many second carbon nanotubes. The second carbon nanotubes are allocated in an orderly manner on the first CNT layer. At least two of the second carbon nanotubes are arranged along a first curve. There is a first whirlpool pattern located on the surface of the second CNT layer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

1. A CNT Plate

Figure 1:
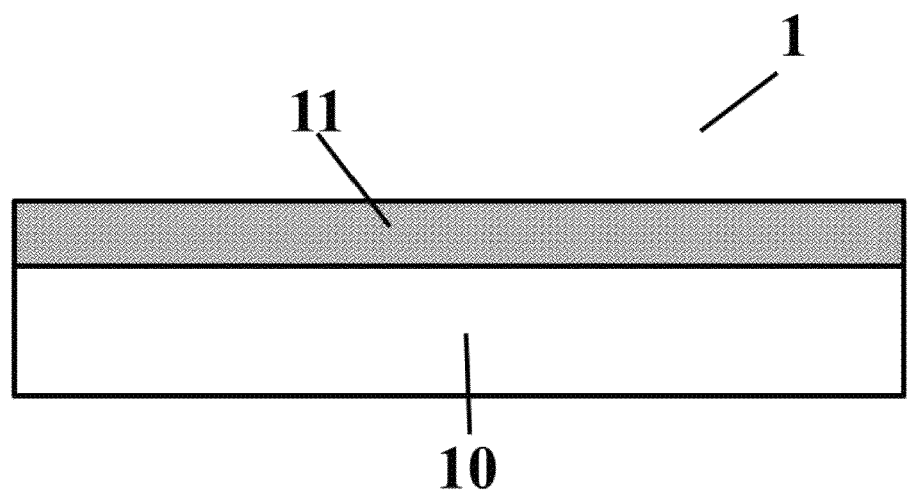
FIG. 1 shows one embodiment of a CNT plate of the present invention.

As shown in FIG. 1, the present invention provides a CNT plate 1. The CNT plate 1 may comprise a first CNT layer 10 and a second CNT layer 11. The first CNT layer 10 may comprise carbon nanotubes. The second CNT layer 11 may be disposed on the first CNT layer 10.

The shape of the first CNT layer 10 may be circular, rectangular, or any other kind of shape. The shape of the first CNT layer 10 may be similar to that of the second CNT layer 11.

Figure 2:
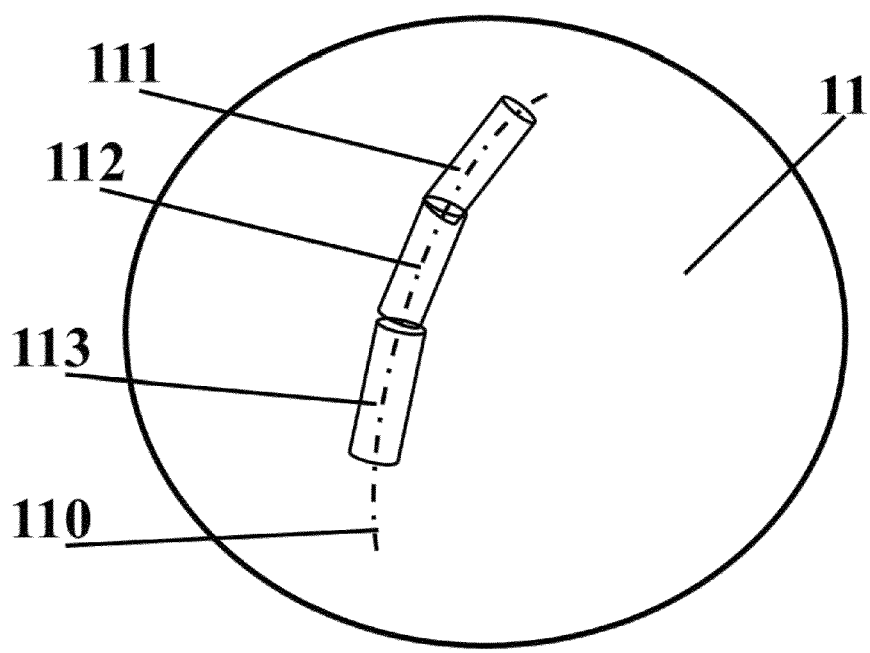
FIG. 2 shows the allocation of the carbon nanotubes on the CNT plate of the present invention.
Figure 3:
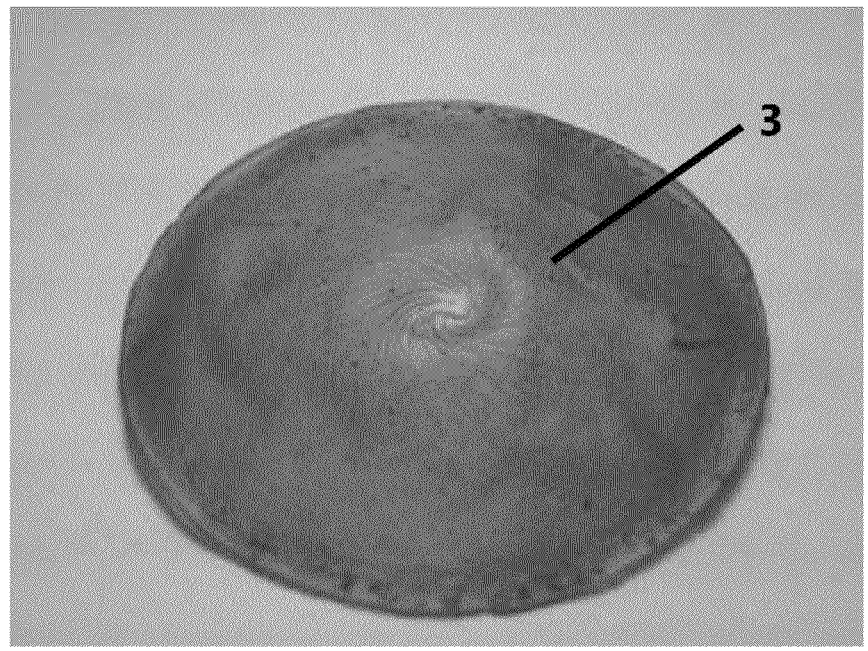
FIGS. 3a and 3b show a photograph and sketch of the top view of the CNT plate of the present invention.
Figure 3:
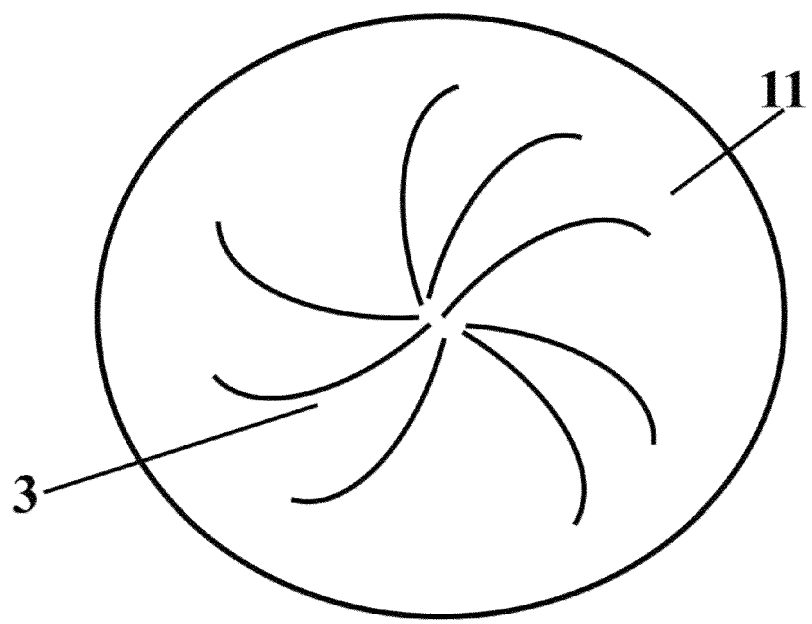

The second CNT layer 11 comprises carbon nanotubes. As shown in FIG. 2, for instance, the carbon nanotubes 111, 112, 113 are located in an orderly manner on the first CNT layer 10. At least two of the carbon nanotubes 111, 112, 113 are allocated along a first curve 110 (shown as a dot-dash line). As shown in FIG. 3(b), there is a whirlpool pattern 3 on the surface of the second CNT layer 11. FIG. 3(a) shows a photo of the whirlpool pattern 3 on the CNT layer 11.

In some embodiments, in the CNT plate 1, the second CNT layer 11 contains metals or metal ions. The metal may be iron (Fe), titanium (Ti), or zinc (Zn).

In some embodiments, in the CNT plate 1, the first CNT layer 10 also contains metals or metal ions. The metal may be Fe, Ti, or Zn.

Figure 4:
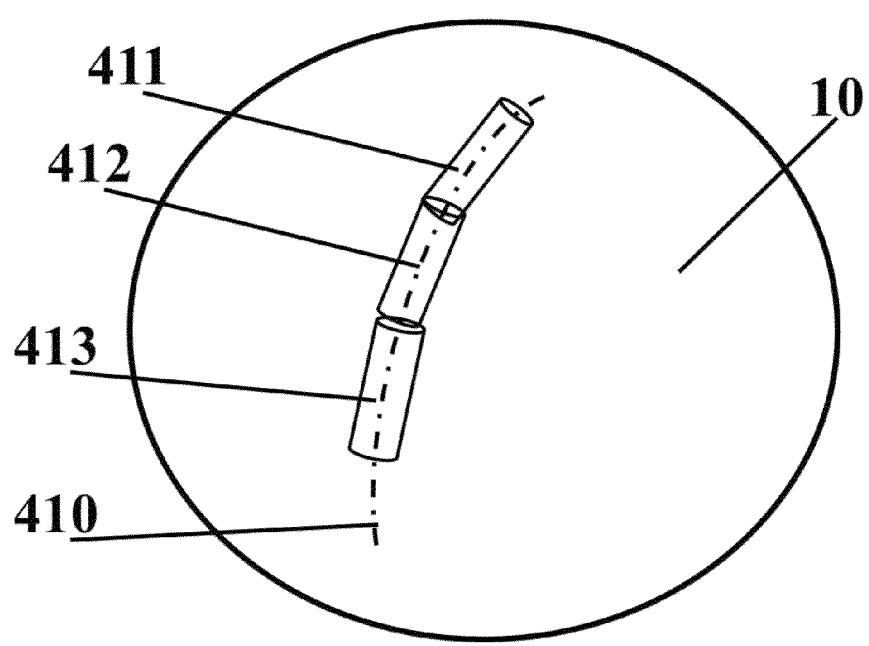
FIG. 4 shows the arrangement of the carbon nanotubes on the CNT plate of the present invention.

As shown in FIG. 4, the structure of the first CNT layer 10 is similar to that of the second CNT layer 11. The first CNT layer 10 comprises carbon nanotubes. The carbon nanotubes 411, 412, 413 are located in an orderly manner on the first CNT layer 10. As shown in FIG. 4, at least two of the carbon nanotubes 411, 412, 413 are allocated along a second curve 410 (shown as a dot-dash line).

2. A Method for Manufacturing A CNT Plate

The present invention further provides a method for manufacturing a plate 1 having a CNT layer. The method comprises: providing a carbon nanotube solution, wherein the carbon nanotube solution comprises a liquid or a liquid-phase material; providing a substrate; covering the substrate with the carbon nanotube solution; letting the liquid of the carbon nanotube solution penetrate the substrate to form a CNT layer on the substrate; using an organic compound solution to remove the liquid from the CNT layer; using a cleaner to remove the organic compound solution from the CNT layer; and removing the cleaner from the CNT layer.

In the step of providing a carbon nanotube solution, the carbon nanotube solution comprises many carbon nanotubes and a liquid or a liquid-phase material. The liquid or liquid-phase material may include a surfactant and a solvent. The surfactant may be Triton X-100. The solvent may be water or another hydrophilic solution. The surfactant suspends the carbon nanotubes in the solvent.

In the step of providing a substrate, the substrate is non-conductive. The substrate may be composed of a paper or polymer material. The shape of the substrate may be circular, rectangular, or any other kind of shape. In addition, the liquid of the carbon nanotube solution may penetrate the substrate. In other words, the substrate may have a large number of carbon nanotubes which remain on the substrate. The substrate may be a filter material that is capable of separating the carbon nanotubes from the liquid.

In the step of covering the substrate with the carbon nanotube solution, the method of the present invention further comprises: providing a container; leaving the substrate on the bottom of the container; and pouring the carbon nanotube solution into the container.

In the step of letting the liquid penetrate the substrate, a CNT layer will be formed on the substrate. In this step, the method of the present invention further comprises making the atmospheric pressure above the substrate larger than the atmospheric pressure below the substrate. Because of the difference in pressure, the speed of penetration of the liquid will increase. In addition, in this step, the method of the present invention further comprises creating a whirlpool in the carbon nanotube solution. For example, a mixer can be used to create the whirlpool. The mixer has a flow impeller. Controlling the rotating speed of the flow impeller can change the pattern of the whirlpool.

In the step of using an organic compound solution to remove the liquid from the CNT layer, the organic compound solution may be a solution containing iso-propanol.

In the step of using a cleaner to remove the organic compound solution from the CNT layer, the cleaner may be water.

In the step of removing the cleaner from the CNT layer, the method of the present invention further comprises heating the CNT layer and the substrate. In other words, by the mechanism of mass transfer, the cleaner will be removed from the CNT layer.

Lastly, the CNT layer is peeled from the substrate so as to obtain the CNT plate 1 of the present invention.

In order to prepare a CNT plate 1 containing metal ions or metals, it is necessary to dope metal ions into the peeled CNT layer. The method for doing so may be electrophoresis. In other words, one electrode and the peeled CNT layer are placed into a solution of metal ions. Then, by controlling the current flow between the electrode and the peeled CNT layer, the metal concentration of the CNT layer 10 or 11 of the CNT plate can be adjusted. In other words, the metal ions penetrating into the CNT plate 1 may be concentrated in the second CNT layer 11. The metal ions going into the CNT plate 1 may also be distributed in both the CNT layer 10 and CNT layer 11.

More details of the embodiments of the present invention are illustrated as follows.

3. Preparation of Buckypapers without Metal Ions

The present invention further provides a method for making a buckypaper.

First, a CNT solution is provided. The preparation of the CNT solution follows the steps:

Add 0.03 g of carbon nanotubes having a length of 10 to 40 μm and 0.3 g Triton X-100 into a container having distilled water so as to form a 0.25 liter CNT solution. The carbon nanotube may be a multi-walled carbon nanotube (MWCNT), or a single-walled carbon nanotube (SWCNT).

Place the container in an ultrasonic processor. Use ultrasonic power of 63 watts to disperse the carbon nanotubes. The process will take 5 minutes. In this step, the carbon nanotubes will not agglomerate in the solvent. It should be noted that an increase of ultrasonic power can improve the dispersion of carbon nanotubes but, to some extent, the carbon nanotubes will be broken by the ultrasonic power.

Add distilled water into the container to increase the volume of the CNT solution to 0.5 liters. Next, continue the dispersion process with 63 watts ultrasonic power to disperse the carbon nanotubes for another 20 minutes. After this step, the carbon nanotubes will be more dispersed in the solvent.

Divide the CNT solution of 0.5 liters into five cups, each cup having 0.1 liter of the CNT solution. For each cup, add distilled water to dilute the CNT solution to obtain a CNT solution of 0.4 liters. Next, place each cup in an ultrasonic processor to use ultrasonic power of 63 watts to disperse the carbon nanotubes in the cup. The ultrasonic process takes 30 minutes. After this step, the carbon nanotubes will be more dispersed in the solvent.

Repeat steps (1) to (4) to obtain ten cups, each cup having a CNT solution of 0.4 liters.

After the preparation of a CNT solution, use a vacuum filter to separate carbon nanotubes from the CNT solution, so that a CNT layer will be formed in the filter paper.

The vacuum filter comprises a porcelain filter and a filtrate container. The porcelain filter is combined with the filtrate container through an elastic tube. The porcelain filter has a tube that is inserted into the filtrate container. The filtrate will flow into the filtrate container through the tube. The filtrate container has a gas-out tube through which the gas in the filtrate container can be sucked from the filtrate container.

Place one filter paper on the porcelain filter. The step of providing a substrate will then be complete.

Pour 0.4 liters of the CNT solution mentioned above into the porcelain filter. Then cover the filter paper with the CNT solution. The step of covering the substrate with the CNT solution is now complete.

Next, a vacuum filtration is carried out. Use a pump to remove the gas from inside the filtrate container. The air will start to leave the filtrate container through the gas-out tube. As a result, the carbon nanotubes in the CNT solution will gradually be deposited on the filter paper during the vacuum filtration. In the meantime, create a whirlpool in the CNT solution contained in the porcelain filter. For example, use a mixer to create a whirlpool. The step of letting the liquid of the CNT solution penetrate the substrate to form a CNT layer on the substrate will then be complete.

Pour all ten cups of a CNT solution of 0.4 liters, one by one, into the porcelain filter as so to operate a vacuum filtration. The process will take 10 to 12 hours. A buckypaper can then be formed on filter paper, and the diameter of the buckypaper is about 4.2 microns (μ).

Next, submerge the buckypaper in a solution containing iso-propanol. The submerging process will take more than three hours so as to remove the surfactant Triton X-100 from the buckypaper. This will complete the step of using an organic compound solution to remove the liquid from the CNT layer.

Next, remove the buckypaper from the iso-propanol solution. Place the buckypaper in moving water to remove iso-propanol from the buckypaper. The step of using a cleaner to remove the organic compound solution from the CNT layer will then be completed.

Lastly, dry the buckypaper in a baker. The temperature of the baker is 120 degree Celsius. This step will take 30 minutes. This will complete the step of removing the cleaner from the CNT layer.

Now, the buckypaper is still attached to the filter paper. Once the buckypaper is peeled off of the filter paper, one piece of buckypaper of the present invention is obtained, as shown in FIG. 3(a).

4. Preparation of Buckypapers Containing Metal Ions

The present invention further provides a method for preparing buckypapers containing metal ions.

First, pick up one buckypaper made by the previously-mentioned method, wherein the buckypaper has no metals. Next, carry out electrophoresis to implant metals or metal ions into the buckypaper. Lastly, bake the buckypaper so as to complete a buckypaper doped with metal ions or metals.

The present invention further provides the following details of how to carry out the electrophoresis.

(1) Prepare an electrophoresis solution that may be a ferric nitrate solution, titanium nitrate solution, or zinc nitrate.

(2) Set the graphite electrode as a positive electrode and the buckypaper as a negative electrode, and place the graphite electrode and buckypaper into the electrophoresis solution.

(3) Begin the electrophoresis, wherein the operating parameters include the metal ion concentration and current flow.

In the step of baking the buckypaper, the buckypaper that has completed electrophoresis is first put into a baker. The baker contains oxygen. The baking process requires 200 degrees Celsius. The process takes about three hours.

In some embodiments, there are two sets of operating parameters for electrophoresis. The first set includes 0.01 M for the electrophoresis solution, 0.01 mA for the current flow, and 10 seconds for the electrophoresis time. The second set includes 0.1 M for the electrophoresis solution, 1 mA for the current flow, and 300 seconds for the electrophoresis time. The samples made through the former operating parameter set are called "a lowly metal-doped buckypaper." The samples made via the latter operating parameter set are called "a highly metal-doped buckypaper."

5. Heat-Sensitive Batteries

Figure 5:
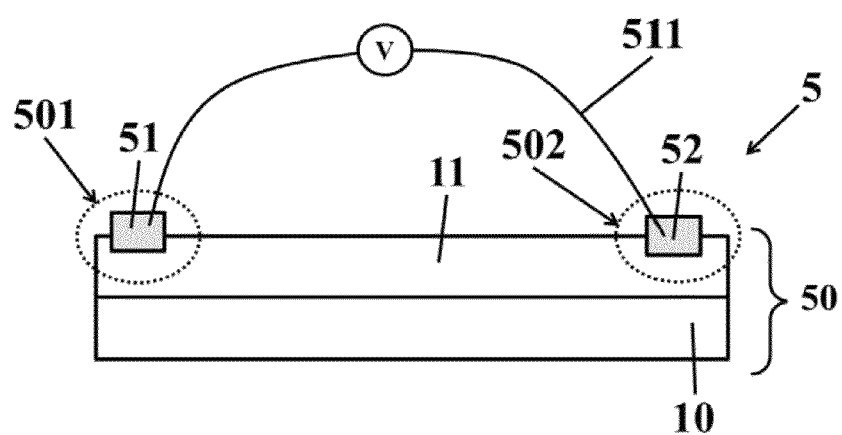
FIG. 5 shows one embodiment of a heat-sensitive battery of the present invention.

As shown in FIG. 5, the present invention further provides an application for the CNT plate 1 mentioned above. The application is a heat-sensitive battery 5 that comprises a first electrode 51, a second electrode 52, and a first CNT plate 50. The first CNT plate 50 comprises a first end 501 and a second end 502. The first electrode 51 electrically connects the first end 501, and the second electrode 52 electrically connects the second end 502. In addition, regarding the structure of the first CNT plate 50, reference is made to the foregoing descriptions of FIGS. 1 to 4.

Figure 6:
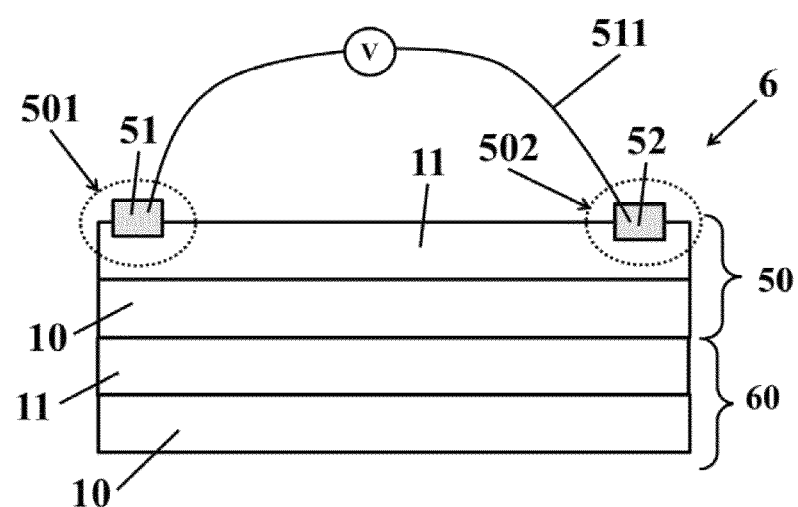
FIG. 6 shows one embodiment of a heat-sensitive battery of the present invention.

As shown in FIG. 6, the present invention further provides a heat-sensitive battery 6 that comprises a first electrode 51, a second electrode 52, a first CNT plate 50 and a second CNT plate 60. The first CNT plate 50 comprises a first end 501, and a second end 502. The first electrode 51 electrically connects the first end 501, and the second electrode 52 electrically connects the second end 502. In addition, regarding the structure of the first CNT plate 50, reference is made to the foregoing descriptions of FIGS. 1 to 4. The structure of the second CNT plate 60 is similar to that of the first CNT plate 50.

It should be noted that the carbon nanotubes used in the battery of the present invention may be MWCNTs or SWCNTs.

It should also be noted that FIGS. 5 and 6 show a wire 511 connecting the first electrode 51 and the second electrode 52. However, the wire 511 is not a necessary part of the heat-sensitive battery of the present invention.

The first CNT plate 50 may be "a lowly metal-doped buckypaper" or "a highly metal-doped buckypaper." The metal may be Fe, Ti or Zn.

The first CNT plate 60 may be "a lowly metal-doped buckypaper" or "a highly metal-doped buckypaper." The metal may be Fe, Ti or Zn.

The batteries illustrated in FIGS. 5 and 6 can be heat-sensitive because the CNT plates 50, 60 are a semiconductor material. Three tests were done to verify such observation: the Hall-effect analysis, four-point probe analysis, and thermo-effect analysis.

According to the Hall-effect analysis, the resistance of the buckypaper of the present invention ranges from $5.52 \times 10^{-4}$ to $1.63 \times 10^{-3} \Omega \cdot M$. The Hall voltage ($V_H$) of the buckypaper of the present invention is positive, so the buckypaper is a p-type semiconductor.

According to the four-point-probe analysis, the resistance from such measurement showed that the buckypaper of the present invention is somewhat between semiconductor and metal.

According to the thermo-effect analysis, the resistance of the buckypaper of the present invention rises as the temperature of the buckypaper goes down. This phenomenon is called the "negative temperature coefficient effect." Accordingly, the buckypaper of the present invention is closer to a semiconductor. The reason for the "negative temperature coefficient effect" is that, when the temperature of the buckypaper goes down, the energy gap of carbon nanotube materials becomes larger, so that the number of electrons jumping across the energy band decreases. The electrons cannot easily transmit, so the resistance of the buckypaper rises.

Because of the "negative temperature coefficient effect," the heat-sensitive batteries 5, 6 of the present invention can operate under the theory of the Seebeck effect. In other words, assuming that the temperature of the first end 501 is $T_1$ and the temperature of the second end 502 is $T_2$. If $T_1 > T_2$, there will be a current flow from the first end 501 to the second end 502. Then, if there is an electrical connection by a wire 511 (as shown in FIGS. 5 and 6) between the first electrode 51 and the second electrode 52, there will be a current loop. This is a heat-sensitive battery. Also, if $T_1 = T_2$, there is no current.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

I claim:

1. A carbon nanotube plate, comprising:
   a first carbon nanotube layer, wherein the first carbon nanotube layer is composed of a plurality of first carbon nanotubes; and
   a second carbon nanotube layer disposed on the first carbon nanotube layer;
   wherein the second carbon nanotube layer is composed of a plurality of second carbon nanotubes;
   wherein the second carbon nanotubes are allocated in an orderly manner on the first carbon nanotube layer;
   wherein at least two of the second carbon nanotubes are located along a first curve; and
   wherein a surface of the second carbon nanotube layer has a whirlpool pattern.

2. A carbon nanotube plate as claimed in claim 1, wherein the second carbon nanotube layer contains metal ions.

3. A carbon nanotube plate as claimed in claim 1, wherein the first carbon nanotube layer contains metal ions.

4. A carbon nanotube plate as claimed in claim 1, wherein at least two of the first carbon nanotubes are allocated along a second curve.

5. A heat-sensitive battery, comprising:
- a first electrode;
- a second electrode; and
- a first carbon nanotube plate having a first end and a second end, wherein the first electrode connects the first end electrically, and the second electrode connects the second end electrically;
- wherein the first carbon nanotube plate comprises:
- a first carbon nanotube layer comprising a plurality of first carbon nanotubes; and
- a second carbon nanotube layer disposed on the first carbon nanotube layer;
- wherein the second carbon nanotube layer comprises a plurality of second carbon nanotubes, the second carbon nanotubes are disposed in an orderly manner on the first carbon nanotube layer, at least two of the second carbon nanotubes are disposed along a first curve, and a surface of the second carbon nanotube layer has a first whirlpool pattern.

6. A heat-sensitive battery as claimed in claim 5, wherein the second carbon nanotube layer comprises metal ions.

7. A heat-sensitive battery as claimed in claim 5, wherein the first carbon nanotube comprises metal ions.

8. A heat-sensitive battery as claimed in claim 5, wherein at least two of the first carbon nanotubes are located in an orderly manner along a second curve.

9. A heat-sensitive battery as claimed in claim 5, further comprising a second carbon nanotube plate disposed on one side of the first carbon nanotube plate;
- wherein the second carbon nanotube plate comprises:
- a third carbon nanotube layer comprising a plurality of third carbon nanotubes; and
- a fourth carbon nanotube layer disposed on the third carbon nanotube layer;
- wherein the fourth carbon nanotube layer comprises a plurality of fourth carbon nanotubes, the fourth carbon nanotubes are disposed in an orderly manner on the third carbon nanotube layer, at least two of the fourth carbon nanotubes are located in an orderly manner along a third curve, and a surface of the fourth carbon nanotube layer has a second whirlpool pattern.

10. A heat-sensitive battery as claimed in claim 9, wherein the fourth carbon nanotube layer comprises metal ions.

* * * * *